United States Patent
Shin et al.

(10) Patent No.: US 6,187,686 B1
(45) Date of Patent: Feb. 13, 2001

(54) METHODS FOR FORMING PATTERNED PLATINUM LAYERS USING MASKING LAYERS INCLUDING TITANIUM AND RELATED STRUCTURES

(75) Inventors: Hwa-sook Shin; Byeong-yun Nam, both of Kyungki-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/325,171

(22) Filed: Jun. 3, 1999

Related U.S. Application Data

(62) Division of application No. 08/789,794, filed on Jan. 29, 1997, now abandoned.

(30) Foreign Application Priority Data

Jun. 17, 1996 (KR) .................................................. 96-21852

(51) Int. Cl.[7] ........................ H01L 21/44; H01L 21/461; C03C 25/68; C23F 1/00
(52) U.S. Cl. ........................ 438/720; 438/669; 438/742; 216/51; 216/72; 216/75
(58) Field of Search ..................................... 438/737, 738, 438/742, 656, 592, 671, 669, 686, 720; 216/101, 41, 51, 72, 75

(56) References Cited

U.S. PATENT DOCUMENTS

| 3,657,029 | 4/1972 | Fuller ........................................ 156/11 |
| 4,335,502 | * 6/1982 | Richman ................................. 29/571 |
| 5,515,984 | 5/1996 | Yokoyama et al. ..................... 216/41 |
| 5,567,964 | * 10/1996 | Kashihara et al. .................... 257/310 |
| 5,717,250 | 2/1998 | Schuele et al. ........................ 257/754 |
| 5,776,823 | * 7/1998 | Agnello et al. ........................ 438/592 |

* cited by examiner

*Primary Examiner*—John F. Niebling
*Assistant Examiner*—Ha Tran Nguyen
(74) *Attorney, Agent, or Firm*—Myers Bigel Sibley & Sajovec

(57) ABSTRACT

A method for forming a patterned platinum layer on a microelectronic substrate includes the steps of forming a platinum layer on the microelectronic substrate, and forming a mask layer on the platinum layer. In particular, the mask layer defines exposed portions of the platinum layer, and the mask layer comprises a mask material including titanium. The exposed portions of the platinum layer are then selectively removed to form the patterned platinum layer. Related structures are also disclosed.

9 Claims, 2 Drawing Sheets

METHODS FOR FORMING PATTERNED PLATINUM LAYERS USING MASKING LAYERS INCLUDING TITANIUM AND RELATED STRUCTURES

RELATED APPLICATIONS

This application is a divisional application of U.S. patent application Ser. No. 08/789,794 filed Jan. 29, 1997 now abandoned and entitled METHODS FOR FORMING PATTERNED PLATINUM LAYERS USING MASKING LAYERS INCLUDING TITANIUM AND RELATED STRUCTURES.

FIELD OF THE INVENTION

The present invention relates to the field of microelectronics and more particularly to the field of patterning microelectronic layers.

BACKGROUND OF THE INVENTION

As integrated circuit memory devices become more highly integrated, the demand for high performance gate electrodes increases. In particular, as memory capacities of dynamic random access memories (DRAM) exceed 1 gigabit, gate electrodes made from materials having a low resistivity and a work function corresponding to half the energy gap of silicon are needed. Currently, polycide structures including a silicide (a heat-treated compound of metal and silicon) which is formed on polysilicon are used to form gate electrodes. In particular, tungsten silicide and titanium silicide are widely used in these polycide structures.

As gate electrode materials improve, the resistance thereof decreases, and memory devices using these improved gate electrode materials can perform operations more quickly. Other problems may, however, result. For example, a titanium-polycide gate electrode can have a resistivity which is about one quarter that of a comparable tungsten-polycide gate electrode. When a titanium-polycide gate electrode is etched, however, the sidewalls of the gate electrode pattern may be eroded significantly. This erosion problem may be reduced by using low temperature test processes or time modulation systems. These approaches, however, may reduce process margins.

Platinum-polysilicon gate electrode structures are currently being studied to address the above mentioned problems. In particular, a platinum-polysilicon gate electrode structure can be used to reduce the gate electrode resistivity, to reduce erosion of gate electrode sidewalls, and to reduce the complexity of the gate electrode structure. For example, the resistances of various materials used to form comparable gate electrode structures are as follows: the resistance of a tungsten polycide gate can be approximately 80 $\mu\Omega$·cm; the resistance of a titanium polycide gate can be approximately 20 $\mu\Omega$·cm; and the resistance of a platinum polysilicon gate can be approximately 10 $\mu\Omega$·cm.

Platinum, however, is so chemically stable that it does not readily produce compounds having significantly high vapor pressures. Accordingly, platinum may be difficult to etch. When a platinum layer is etched using a photoresist mask and a chlorine series plasma gas, the photoresist may be etched more quickly than the platinum film. Accordingly, a photoresist mask may be insufficient when etching platinum making it difficult to form patterns having relatively high resolutions. The etching selectivity with respect to the photoresist is higher when a fluorine-series plasma gas is used to etch platinum. After etching a platinum layer using a fluorine-series gas, however, significant polymeric residues may be produced on the sidewalls of the patterned platinum layer.

Furthermore, when a fluorine-series plasma gas is used to etch a platinum layer, oxide may be etched too quickly to act as a mask. When a chlorine-series plasma gas is used, an oxide mask may be damaged. An oxide mask should thus be five times thicker than the platinum layer being patterned. Accordingly, an oxide mask may generate micro loading problems during the formation of patterns having relatively high resolutions. In addition, an adhesion layer may be needed to bond the platinum layer and the oxide layer which is used to form the oxide mask.

SUMMARY OF THE INVENTION

It is therefor an object of the present invention to provide improved methods for forming patterned platinum layers and related structures.

It is another object of the present invention to provide improved methods for forming gate electrodes and related structures.

It is still another object of the present invention to provide methods for forming patterned platinum layers having reduced sidewall erosion and residue generation, and related structures.

These and other objects are provided according to the present invention by methods including the steps of forming a platinum layer on a microelectronic substrate, forming a mask layer on the platinum layer wherein the mask layer comprises a mask material including titanium, and selectively removing exposed portions of the platinum layer to form the patterned platinum layer. A high degree of etching selectivity between the platinum layer and the mask layer can thus be achieved thereby reducing sidewall erosion and residue generation.

More particularly, mask materials including titanium and titanium nitride may provide a high degree of etch selectivity. The step of selectively removing exposed portions of the platinum layer can include etching the exposed portions of the platinum layer using a gas mixture including chlorine $Cl_2$ and oxygen $O_2$. A mixture including at least 40% oxygen can further increase the selectivity of the etch.

The step of forming the platinum layer can be preceded by the step of forming a barrier layer on the microelectronic substrate. This barrier layer can protect the microelectronic substrate during the step of removing the exposed portions of the platinum layer. The barrier layer preferably comprises a material including titanium, such as titanium or titanium nitride. As discussed above, these materials have a high etching selectivity with respect to platinum so that the platinum layer can be etched without significantly damaging the barrier layer or the microelectronic substrate below the barrier layer. As will be understood by those having skill in the art, the microelectronic substrate can be defined to include a semiconductor substrate as well as oxide and polysilicon layers on the semiconductor substrate.

According to alternate aspects of the present invention, methods for forming a gate electrode structure on a microelectronic substrate are also provided. These methods include the steps of forming a polysilicon layer on the microelectronic substrate, forming a platinum layer on the polysilicon layer opposite the substrate, and forming a mask layer on the platinum layer. In particular, the mask layer defines exposed portions of the platinum layer, and the mask layer comprises a mask material including titanium. The exposed portions of the platinum layer are then selectively removed thereby defining exposed portions of the polysilicon layer. The exposed portions of the polysilicon layer are then removed completing the gate structure.

According to still other aspects of the present invention, microelectronic structures are provided. In particular, microelectronic structures according to the present invention can include a platinum layer on a microelectronic substrate, and a mask layer on the platinum layer wherein the mask layer comprises a mask material including titanium. In particular, the platinum layer and the mask layer can together define a mesa structure on the microelectronic substrate, and the mask material can be chosen from the group consisting of titanium and titanium nitride.

According to the methods and structures of the present invention, a titanium or titanium nitride mask can be used when patterning a platinum layer to reduce sidewall erosion thereof. In addition, the generation of residues can be reduced. The reliability of integrated circuit devices formed using these methods and structures can thus be increased.

DETAILED DESCRIPTION OF THE INVENTION

Figure 1:
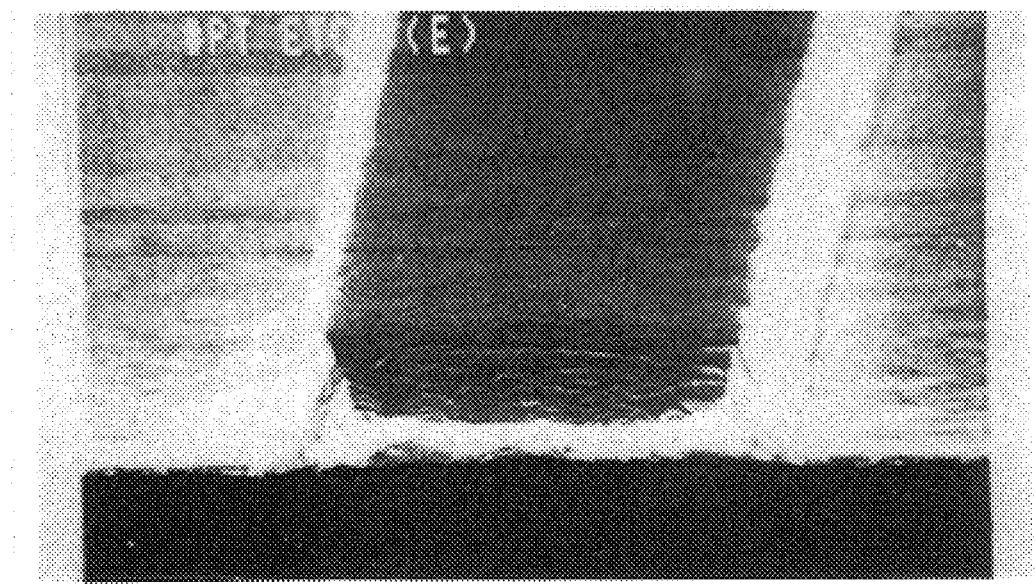
FIG. 1 is a scanning electron microscope photograph illustrating a platinum layer patterned using a method according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

According to a method of the present invention, a platinum layer can be etched using a mask comprising a material including titanium thus reducing sidewall erosion, residue generation, and manufacturing complexity. In particular, the mask can be formed from a layer of titanium or titanium nitride, and the platinum can be etched using a plasma gas mixture including oxygen gas ($O_2$) and chlorine gas ($Cl_2$). By mixing the oxygen gas at a ratio of at least 40% when forming the $Cl_2/O_2$ gas mixture, the etch selectivity of a titanium mask or a titanium nitride mask with respect to a platinum layer can be greatly increased. Accordingly, a titanium or titanium nitride mask will not be significantly etched or eroded when etching the platinum layer, thereby allowing the formation of a patterned platinum layer having relatively high resolution.

Using a method according to the present invention, a platinum layer can be formed having a thickness of approximately 2700 Å, and a titanium layer can be formed thereon having a thickness of approximately 300 Å. The platinum layer can then be patterned using the titanium layer as a mask so that the sidewalls of the resulting patterned platinum layer are not significantly eroded. As shown in FIG. 1, the resulting patterned platinum layer can have a slope of 60° or more.

Figure 2:
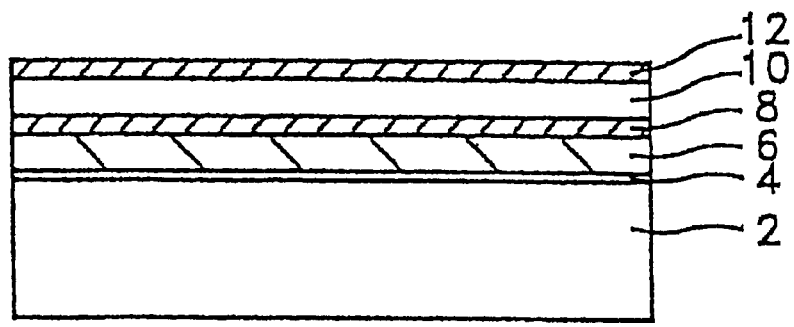
FIGS. 2 to 4 are cross-sectional views illustrating steps of a method for forming a platinum-polysilicon gate electrode according to the present invention.
Figure 3:
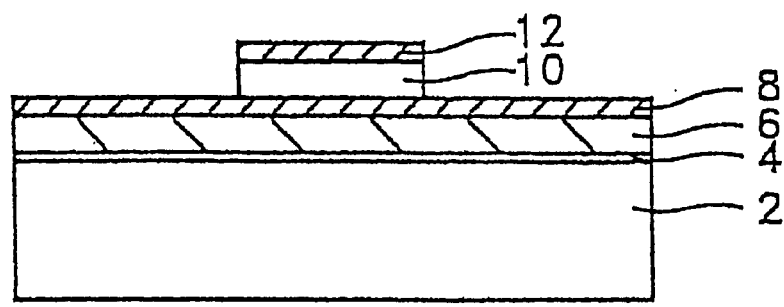
Figure 4:
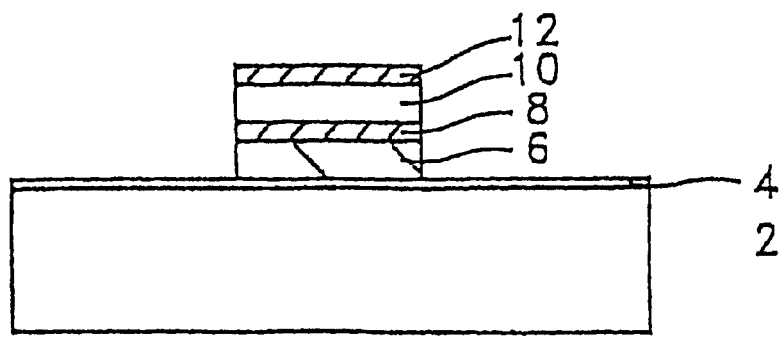

FIGS. 2 to 4 illustrate steps of a method for forming a platinum-polysilicon gate electrode structure according to the present invention. As shown in FIG. 2, a gate insulating layer 4 can be formed on the surface of a semiconductor substrate 2 by growing a thin thermal oxide layer. A doped polysilicon layer 6 can be formed on the gate insulating layer 4, and a barrier layer 8 can be formed on the polysilicon layer. The barrier layer 8 is formed from a barrier metal such as titanium or titanium nitride, and the barrier layer 8 reduces interaction such as mutual diffusion between the polysilicon layer 6 and the platinum layer 10. The platinum layer 10 can be formed on the barrier layer 8 by depositing platinum using a deposition technique such as sputtering or chemical vapor deposition (CVD). A mask layer 12 can be formed on the platinum layer 10 by depositing a layer of titanium or titanium nitride.

The mask layer 12 and the platinum layer 10 can then be etched as shown in FIG. 3. In particular, the mask layer 12 can be etched using a plasma of chlorine ($Cl_2$) and argon (Ar) to form the mask pattern to be transferred to the platinum layer 10. The platinum layer 10 can then be etched using a plasma of chlorine ($Cl_2$) and oxygen ($O_2$). The oxygen is preferably mixed at a ratio of over 40% of the etching gas, allowing the platinum layer 10 to be etched without causing significant damage to the mask layer 12. In addition, the etching selectivity between the barrier layer 8 and the platinum layer 10 can be increased when the oxygen is mixed at a ration of over 40%.

Because the barrier layer 8 will not be significantly damaged when etching the platinum layer 10 using the above mentioned gas mixture, the polysilicon layer 6 will not be etched when etching the platinum layer 10. The barrier layer 8 is then etched using a chlorine ($Cl_2$) and argon (Ar) plasma, and the polysilicon layer 6 is then etched to complete the platinum-polysilicon gate structure as shown in FIG. 4. The method illustrated in FIGS. 2–4 can thus reduce the problems which may occur as a result of the relatively low etching selectivity with respect to polysilicon when forming a tungsten polycide gate or a titanium polycide gate.

In the methods discussed above, a mask layer 12 formed from titanium or titanium nitride has a high etching selectivity relative to the platinum layer 10 being patterned. This etching selectivity is particularly high when a plasma of chlorine $Cl_2$ and oxygen $O_2$ is used as the etchant. The erosion of sidewalls of the platinum layer can thus be reduced. In addition, the generation of residues can be reduced, and the complexity of the overall process can be reduced. Furthermore, if this platinum etching method is used in the formation of a gate electrode for a microelectronic device, the erosion of sidewalls of the is gate electrode and the generation of residues can be reduced thus increasing the reliability of the microelectronic device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a microelectronic gate structure on a microelectronic substrate, said method comprising the steps of:

forming a polysilicon layer on said microelectronic substrate;

forming a platinum layer on said polysilicon layer opposite said substrate;

forming a mask layer on said platinum layer wherein said mask layer defines exposed portions of said platinum layer, wherein said mask layer comprises a mask material including titanium and wherein said mask material is chosen from the group consisting of titanium and titanium nitride;

selectively removing said exposed portions of said platinum layer thus defining exposed portions of said polysilicon layer wherein said step of selectively removing said exposed portions of said platinum layer comprises etching said exposed portion of said platinum layer using a gas mixture including chlorine $Cl_2$ and oxygen $O_2$; and selectively removing said exposed portions of said polysilicon layer.

2. A method according to claim 1 wherein said gas mixture includes at least 40% oxygen $O_2$.

3. A method according to claim 1 wherein said step of forming said polysilicon layer is preceded by the step of forming a gate insulating layer on said microelectronic substrate.

4. A method according to claim 1 wherein said step of forming said platinum layer is preceded by the step of forming a barrier layer on said polysilicon layer opposite said microelectronic substrate.

5. A method according to claim 4 wherein said barrier layer comprises a material including titanium.

6. A method according to claim 5 wherein said step of selectively removing portions of said platinum layer further comprises defining exposed portions of said barrier layer on said exposed portions of said polysilicon layer and wherein said step of selectively removing said exposed portion of said polysilicon layer is preceded by the step of:

selectively removing said exposed portions of said barrier layer.

7. A method for forming a platinum-polysilicon gate on a microelectronic substrate, said method comprising the steps of:

forming a gate insulation layer on the microelectronic substrate;

forming a doped polysilicon layer on said gate insulation layer opposite said substrate;

forming a barrier layer on said polysilicon layer opposite said microelectronic substrate wherein said barrier layer comprises a material chosen from the group consisting of titanium and titanium nitride;

after forming the barrier layer, forming a platinum layer on said doped polysilicon layer opposite said microelectronic substrate;

forming a mask layer on said platinum layer opposite said microelectronic substrate wherein said mask layer comprises a material chosen from the group consisting of titanium and titanium nitride;

etching said platinum layer using said mask layer as an etching mask wherein said step of etching said platinum layer comprises etching said platinum layer using a gas mixture including chlorine $Cl_2$ and oxygen $O_2$; and etching said polysilicon layer using said etched platinum layer as an etching mask.

8. A method according to claim 7 wherein said gas mixture includes a ratio of at least 40% oxygen $O_2$.

9. A method according to claim 7 wherein said step of etching said platinum layer comprises defining exposed portions of said barrier layer, and wherein said step of etching said polysilicon layer is preceded by the step of:

selectively removing said exposed portions of said barrier layer using said etched platinum layer as an etching mask.

* * * * *

UNITED STATES PATENT AND TRADEMARK OFFICE
CERTIFICATE OF CORRECTION

PATENT NO.    : 6,187,686 B1
DATED         : February 13, 2001
INVENTOR(S)   : Hwa-sook Shin and Byeong-yun Nam It is certified that error appears in the above-identified patent and that said Letters Patent is hereby corrected as shown below:

Title page, item [54] and column 1,
Column 1, the title page should read as follows:
-- METHODS FOR FORMING PATTERNED PLATINUM LAYERS USING MASKING LAYERS INCLUDING TITANIUM --

Column 4,
Line 48, please delete "is" before gate electrode.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*